(12) United States Patent
Sudharsanan

(10) Patent No.: US 7,414,550 B1
(45) Date of Patent: Aug. 19, 2008

(54) METHODS AND SYSTEMS FOR SAMPLE RATE CONVERSION AND SAMPLE CLOCK SYNCHRONIZATION

(75) Inventor: Subramania Sudharsanan, Woodinville, WA (US)

(73) Assignee: Nvidia Corporation, Santa Clara, CA (US)

( * ) Notice: Subject to any disclaimer, the term of this patent is extended or adjusted under 35 U.S.C. 154(b) by 68 days.

(21) Appl. No.: 11/428,304

(22) Filed: Jun. 30, 2006

(51) Int. Cl.
*H03M 7/00* (2006.01)

(52) U.S. Cl. .................... 341/61; 341/144; 341/118; 375/355; 375/375; 708/290; 708/313

(58) Field of Classification Search ................. 341/61; 708/313
See application file for complete search history.

(56) References Cited

U.S. PATENT DOCUMENTS

| | | | |
|---|---|---|---|
| 4,868,832 A | 9/1989 | Marrington et al. | |
| 5,220,660 A | 6/1993 | Yoshizawa et al. | |
| 5,331,346 A * | 7/1994 | Shields et al. | 348/441 |
| 5,339,445 A | 8/1994 | Gasztonyi | |
| 5,365,468 A * | 11/1994 | Kakubo et al. | 708/313 |
| 5,510,740 A | 4/1996 | Farrell et al. | |
| 5,530,845 A | 6/1996 | Hiatt et al. | |
| 5,586,308 A | 12/1996 | Hawkins et al. | |
| 5,737,613 A | 4/1998 | Mensch, Jr. | |
| 5,758,133 A | 5/1998 | Evoy | |
| 5,862,368 A | 1/1999 | Miller et al. | |
| 6,057,789 A * | 5/2000 | Lin | 341/61 |
| 6,061,410 A * | 5/2000 | Linz | 375/371 |
| 6,134,167 A | 10/2000 | Atkinson | |
| 6,163,583 A | 12/2000 | Lin et al. | |
| 6,216,234 B1 | 4/2001 | Sager et al. | |
| 6,226,661 B1 * | 5/2001 | Savell | 708/313 |
| 6,252,919 B1 * | 6/2001 | Lin | 375/377 |
| 6,397,340 B2 | 5/2002 | Watts et al. | |
| 6,539,120 B1 | 3/2003 | Sita et al. | |
| 6,600,575 B1 | 7/2003 | Kohara | |
| 6,678,831 B1 | 1/2004 | Mustafa et al. | |
| 6,690,836 B2 | 2/2004 | Natarajan et al. | |
| 6,728,959 B1 | 4/2004 | Merkey | |
| 6,747,581 B2 * | 6/2004 | Hodges | 341/61 |
| 6,754,837 B1 | 6/2004 | Helms | |
| 6,775,776 B1 | 8/2004 | Vogt et al. | |
| 6,804,267 B1 | 10/2004 | Long et al. | |
| 6,816,809 B2 | 11/2004 | Circenis | |
| 6,845,456 B1 | 1/2005 | Menezes et al. | |
| 6,990,594 B2 | 1/2006 | Kim | |
| 7,043,649 B2 | 5/2006 | Terrell, II | |
| 7,061,409 B1 * | 6/2006 | Jantti et al. | 341/61 |
| 7,106,224 B2 * | 9/2006 | Knapp et al. | 341/61 |
| 7,277,101 B2 | 10/2007 | Zeng | |
| 2001/0044909 A1 | 11/2001 | Oh et al. | |
| 2005/0125705 A1 | 6/2005 | Cheng et al. | |

\* cited by examiner

*Primary Examiner*—Khai M. Nguyen

(57) ABSTRACT

The architecture for a combined universal sample rate converter and a sample clock synchronizer is presented. The universal sample rate converter can be applied, for example, to audio samples created or mixed using any of the standard audio frequencies in the set H={8, 11.025, 22.05, 44.1, 48, 96, and 192} kHz and played back using any other frequency from the set H. The synchronizer can be used where audio data are streamed or otherwise broadcast from, for example, the Internet, along with a system timestamp, and where this timestamp needs to be matched to the local audio clock for proper play-back. The same synchronizer can also be used for audio/video or video only synchronization.

20 Claims, 4 Drawing Sheets

METHODS AND SYSTEMS FOR SAMPLE RATE CONVERSION AND SAMPLE CLOCK SYNCHRONIZATION

BACKGROUND

1. Field of the Application

Generally, this application relates to the multimedia data processing. More specifically, it relates to methods and systems for sample rate conversion of multimedia data and sample clock synchronization.

2. Description of the Related Art

Many systems today use or interact with digital multimedia data. One common example is a device capable of playing digital audio music. Typical audio standards for such a device use sampling frequencies of 8, 11.025, 22.05, 44.1, 48, 96 and 192 kilohertz (kHz). These audio samples can be manipulated in a variety of ways. They can be created, stored, mixed or altered using a personal computer, or played using any of a multitude of play-back devices. Often, audio samples are created at one sample rate and played back at a different rate. Further, multiple audio samples created using various sampling rates can be mixed to produce a single audio sample for play-back at a single sampling rate. In these situations, one or more of the audio samples must be converted to the rate of another audio sample before mixing and/or playback can occur.

Generally, sample-rate conversion software or hardware is used for sample rate conversion. While many approaches to sample rate conversion are used today, satisfactory results are difficult to achieve. One reason for this difficulty is that the human ear is quite sensitive to slight distortions or discontinuities in audio samples. Coarse sample rate conversion produces noticeable distortion. Also, conventional sample rate conversion techniques utilize a frame-based sample rate converter that is best suited for fixed sample rate conversions, that is, from one known sample rate to another know sample rate. Use of this frame-based rate converter does not allow for phase corrections.

FIG. 1 illustrates using a first-in, first-out (FIFO) buffer and a phase detector to alter the sampling ratio of a sample rate converter as is known in the art today. FIFO 110 is written with an input audio sample for each pulse of the input clock 150, which operates at input frequency $F_0$. Sample-rate converter 120 reads digital samples from FIFO 110 and outputs digital samples at the output frequency $F_1$ in response to an output clock 170. Sample-rate converter 110 generates derived clock 160 from output clock 170 by multiplying the output clock by Q and dividing by P. Thus derived clock 160 has a derived frequency $F_2$ of $(Q/P)*F_1$. Q and P are chosen so that $F_2$ is about the same as input frequency $F_0$. Thus, FIFO 110 is read and written at about the same frequency. When Q/P is not exactly the same as the ratio of $F_0$ to $F_1$, FIFO 110 is read and written at slightly different rates. FIFO 110 can fill up or become empty. Samples can over-write earlier samples, or random or null data can be output as a sample. Thus simply using a FIFO can produce undesirable audio noise.

As further shown in FIG. 1, sample rate converter 120 is capable of varying the read sample rate to write sample rate ratio, Q/P, in response to adjust signal 130 from phase detector 140. Phase detector 140 compares the instantaneous phase and frequency of input clock 140 to derived clock 160 generated by sample rate converter 120. When the phase or frequency $F_0$ varies from $F_2$, phase detector 140 alters adjust signal 130. Sample rate converter 120 responds to adjust signal 130 by increasing or decreasing the ratio Q/P, thus altering derived clock 160. When derived clock 160 is adjusted sufficiently to match the phase and frequency of input clock 150, then adjust signal 130 stabilizes, causing sample rate converter 120 to stop adjusting derived clock 160. Changes in input clock 170 are thus tracked by sample rate converter 120 in a similar manner to a phase-locked loop (PLL).

However, phase detector 140 is typically a high-precision detector running at a high frequency, for example, at least 1000 times that of input frequency $F_0$, so that phase changes of less than the clock period can be detected. Also, sample-rate converter 120 also needs a large memory for storing many sets of filter coefficients for the many possible ratios of Q/P.

A particular problem with achieving satisfactory sample rate conversion can occur when audio streams are synchronized to independent free-running clocks (i.e., sample rate conversion between a virtually infinite possibility of unknown frequencies). For example, the clocks for the two audio streams may be generated from two different crystal oscillators. Even if the frequencies of these two different crystal oscillators were supposed to be the same, no two oscillators are exactly identical. Slight differences can occur between the two crystals. The frequency difference may be up to 0.1% from nominal. Thus, for a 11025 Hz sample rate, the frequency can be as high as 11025+11.025 or 11036 Hz. When an audio signal that was synchronized to an 11036 Hz crystal oscillator is converted to an 11025 Hz rate, audio samples may be deleted after approximately every one thousand samples. The deleted audio samples can cause audible clicks or pops during sample play-back.

For audio broadcasts or streaming media applications, the clock from the broadcast or streaming source will not necessarily be synchronized to the local audio clock, which can produce instantaneous differences in frequencies, resulting in errors. Gradual accumulation of these errors can result in significant drift between the source and local clocks, which in turn can cause local buffer overflow and eventual breakdown of the broadcast or streaming environment. No elegant solutions exist in purely programmable, digital environments to compensate for this synchronization error.

Therefore, what is needed are methods and systems for universal sample rate conversion of multimedia data samples and sample clock synchronization that are equally applicable either in programmable and weakly-programmable digital signal processing environments.

SUMMARY

The architecture for a combined universal sample rate converter and a sample clock synchronizer is presented. The universal sample rate converter can be applied, for example, to audio samples created or mixed using any of the standard audio frequencies in the set H={8, 11.025, 22.05, 44.1, 48, 96, and 192} kHz and played back using any other frequency from the set H. The synchronizer can be used where audio data are streamed or otherwise broadcast from, for example, the Internet, along with a system timestamp, and where this timestamp needs to be matched to the local audio clock for proper play-back. The same synchronizer can also be used for audio/video or video only synchronization.

BRIEF DESCRIPTION OF THE DRAWINGS

Aspects and features of this application will become apparent to those ordinarily skilled in the art from the following detailed description of certain embodiments in conjunction with the accompanying drawings, wherein.

DETAILED DESCRIPTION

Embodiments will now be described in detail with reference to the drawings, which are provided as illustrative examples of certain embodiments so as to enable those skilled in the art to practice the embodiments, and are not meant to limit the scope of the application in any way. Where aspects of certain embodiments can be partially or fully implemented using known components or steps, only those portions of such known components or steps that are necessary for an understanding of the embodiments will be described, and detailed description of other portions of such known components or steps will be omitted so as not to obscure the understanding of the embodiments. Further, certain embodiments are intended to encompass presently known and future equivalents to the components referred to herein by way of illustration.

According to certain embodiments, the architecture for a combined universal sample rate converter and a sample clock synchronizer is presented. As will be described in further detail below, the universal sample rate converter can be applied, for example, to audio samples created or mixed using any of the standard audio frequencies in the set H={8, 11.025, 22.05, 44.1, 48, 96, and 192} kHz and played back using any other frequency from the set H. The synchronizer can be used where audio data are streamed or otherwise broadcast from, for example, the Internet, along with a system timestamp, and where this timestamp needs to be matched to the local audio clock for proper play-back. The same synchronizer can also be used for audio/video or video only synchronization.

To effectively understand the concepts associated with certain embodiments, it is helpful to first consider the principles of a rational sample rate converter. A rational sample rate converter is one where the sample rate is changed by a ratio N/M, where N and M are both integers, N represents the number of output samples, and M represents the number of input samples, as measured within a specified time period. Thus, the ratio N/M is numerically equivalent to the ratio of output to input sample rates. First, assume that the ratio p=N/M is an integer that is greater than one; that is, the output sample rate is greater than the input sample rate by an integer multiplier. In this first case, the sample rate conversion can be performed by inserting (p−1) zero-valued samples between each of the original samples, followed by low-pass filtering of the signals. Second, assume that the inverse ratio q=M/N is an integer that is greater than one; that is, the input sample rate is greater than the output sample rate by an integer multiplier. In this second case, the sample rate conversion can be performed by sending the original signals through a band-limiting, low pass filter, followed by dropping every (q−1) samples from the filtered signal.

Figure 1:
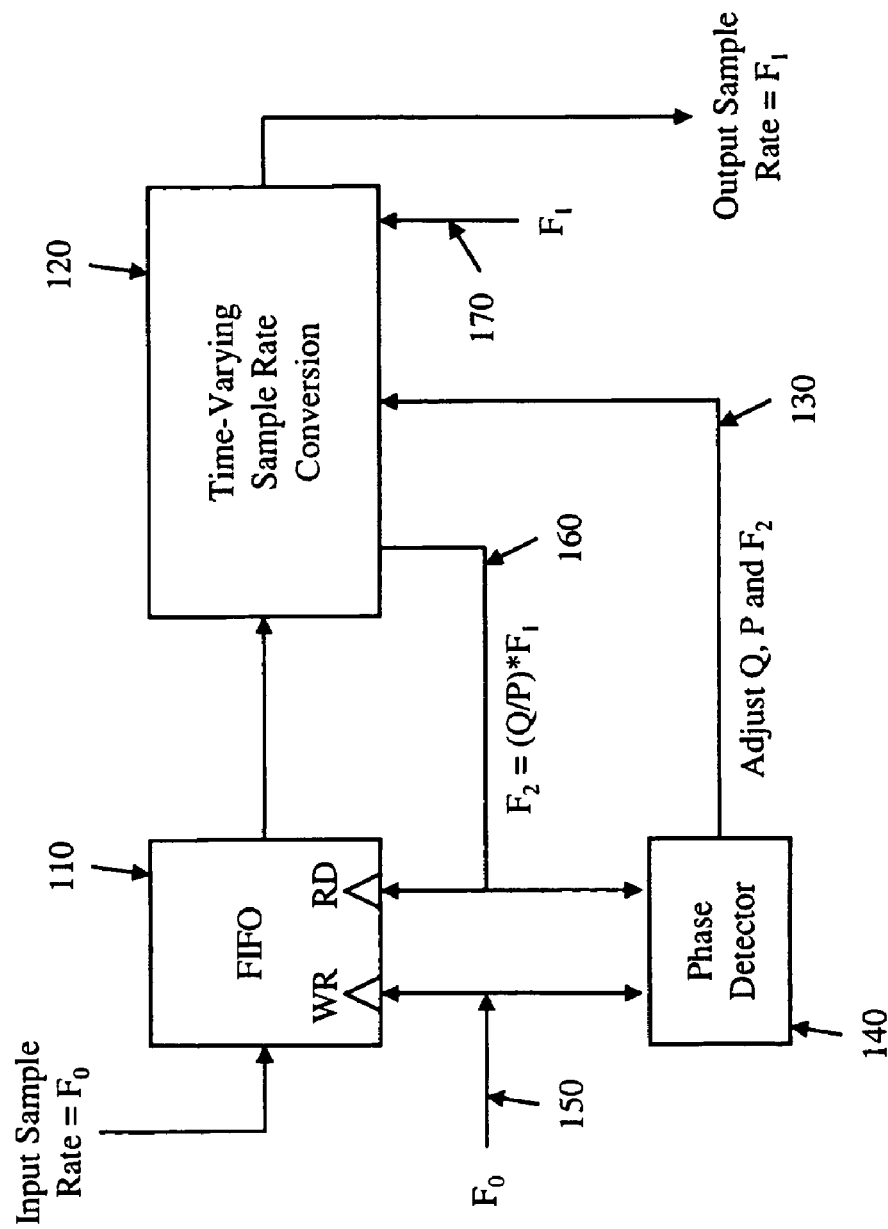
FIG. 1 illustrates using a first-in, first-out (FIFO) buffer and a phase detector to alter the sampling ratio of a sample rate converter as is known in the art today.
Figure 2:
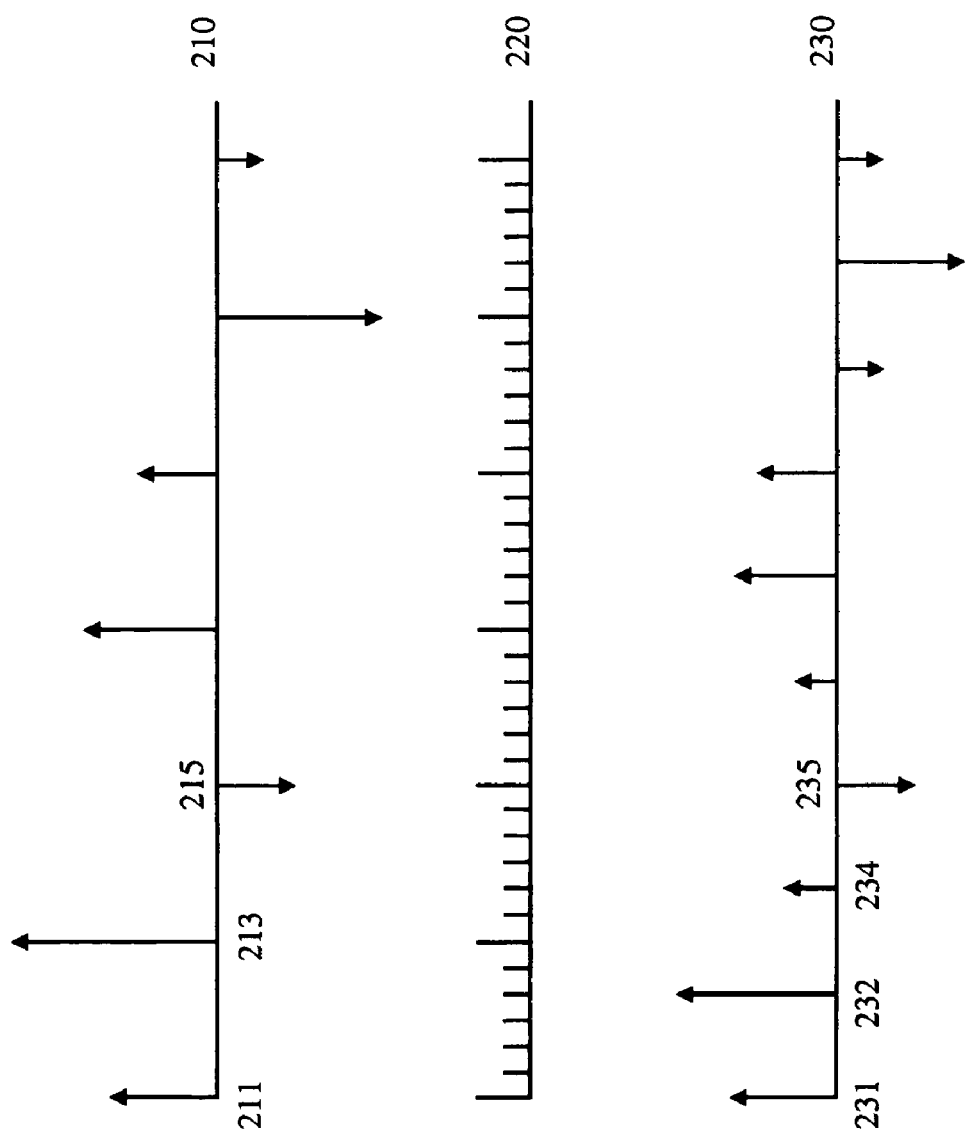
FIG. 2 illustrates an example case of a non-integer p=N/M, where 6/4 oversampling is required according to certain embodiments.

According to certain embodiments, in the case where either p or q is a non-integer value, a rational representation of N/M can be used in the following way. An interpolation of factor N is first carried out, followed by carrying out a decimation of factor M. The cascade filtering operations of interpolation and decimation low pass filters can be collapsed to a single filter. FIG. 2 illustrates an example case of a non-integer p=N/M, where 6/4 oversampling is required according to certain embodiments. As shown, line 210 illustrates the original samples. First, a 6× oversampling interpolation grid is created 220, also referred to as a polyphase grid. Grid 220 is divided into six phases for each of the original samples. Then, interpolations of the original samples 210 are dispersed by a count of four on the 6× oversampling interpolation grid 220 to form the final 6/4 oversampled grid points 230.

As shown in FIG. 2, for example: the first 6/4 oversampled signal 231 coincides with the first original sample 211; the second 6/4 oversampled signal 232 coincides with the fourth sample on the 6× oversampled grid (e.g., based on an interpolation from the first and second original samples 211, 213); the third 6/4 oversampled signal 234 coincides with the eighth sample on the 6× oversampled grid (e.g., based on an interpolation from the second and third original samples 213, 215); the fourth 6/4 oversampled signal 235 coincides with the third original sample 215; and so on. Such a filtering approach is known as polyphase interpolation. The maximum of {N, M}, or L, is the grid oversampling factor and is also known as the number of polyphases. The approach works fine except that interpolations requiring a large L can require several polyphase filters to be used. Also, decimation requires varying filter bandwidth characteristics since bandlimiting should be applied for the input signal to avoid aliasing (i.e., distortion resulting from a low sampling rate). Alternative schemes will be discussed next.

According to certain embodiments, an alternative mechanism is to maintain a filter with a fixed number of polyphases, L (e.g., where L equals 8, 16, 32, etc.). In this alternative, each of the sample locations in the output grid can be determined using a nearest neighbor algorithm to match the polyphase grid. For example, let α=M/N, the inverse ratio, be represented in a P·Q format where P is the integer part of α, and Q is the fractional part of α, and further let n=P+Q be the width of a register. In this example, the original and the resampled grids align at the first sample position (e.g., i=0). If L, the fixed number of polyphases, is a power-of-two number (e.g., 8, or $2^3$), and l=$\log_2$L (e.g., l=3), then the (i+1)$^{th}$ sample position (e.g., 0+3=$3^{rd}$ position) can be represented by the rounded l fractional bits of the value (i×α). In a simple rounding scheme, the rounded l bits can be calculated simply by adding the first l fractional bits with the (i+1)$^{th}$ bit. As will become appreciated to those skilled in the art, more elaborate rounding schemes can be used with certain embodiments, as needed. The integer portion indicates the corresponding position of input samples that have to be considered for filtering.

Figure 3:
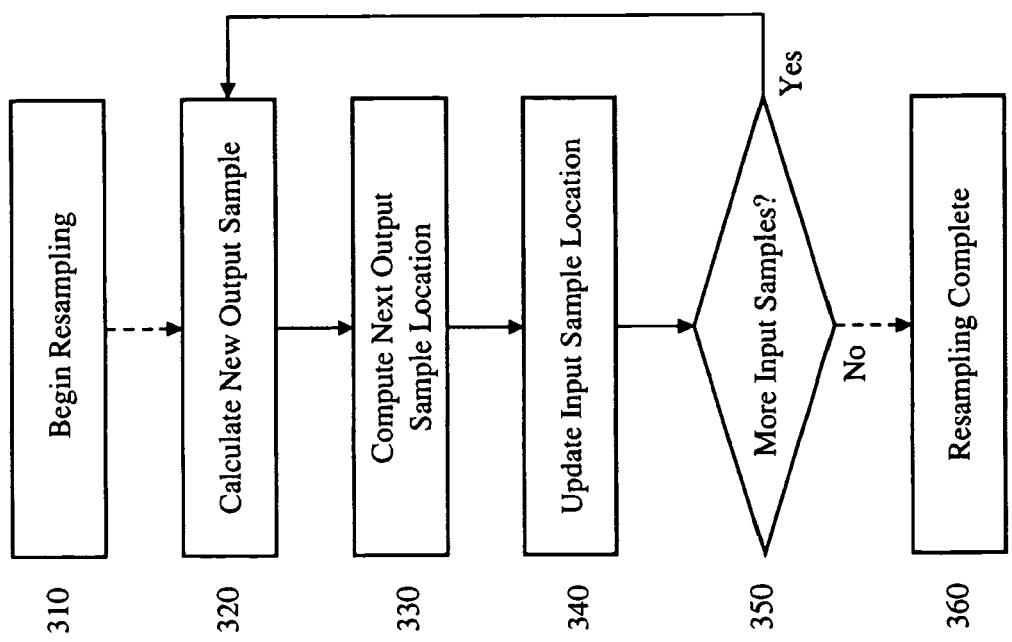
FIG. 3 illustrates at least a portion of an exemplary sample rate conversion process according to certain embodiments.

FIG. 3 illustrates at least a portion of an exemplary sample rate conversion process according to certain embodiments. For this example, let the polyphase filter be $n_l$ for phase l. The exemplary process begins 310 by assuming that the output sample y(j) lies near phase l and between input samples x(i) and x(i+1). Given this assumption, the output sample y(j) can be calculated 320 as:

$$y(j) = \sum_{k=0}^{n_l-l} x(i - I_l - k) h_l(k),$$

where $$I_l = (n_l/2) - \begin{cases} 1 & \text{if } n_l \text{ is even} \\ 0 & \text{if } n_l \text{ is odd} \end{cases}$$

and $h_l(\ )$ are the $l^{th}$ polyphase coefficients. The next output sample y(j+1) location can then be computed 330 by adding α to the accumulator. The rounded fractional part of the accumulator now provides the new polyphase number (i.e., for calculating output sample y(j+1)) and the integer part of accumulator can be given as β. Next, the input sample location can be updated 340 using i=i+β. Then the integer part of the accumulator can be set to zero before the next sample update. Assuming there continue to be input samples 350, the next output sample can be calculated 320 using the updated i and the polyphase filter corresponding to the rounded fractional bits. This procedure can continue throughout resampling and can result in a set of output samples that will correspond to the required output sample rate. Once there are no more input samples, this exemplary process is complete 360.

Figure 4:
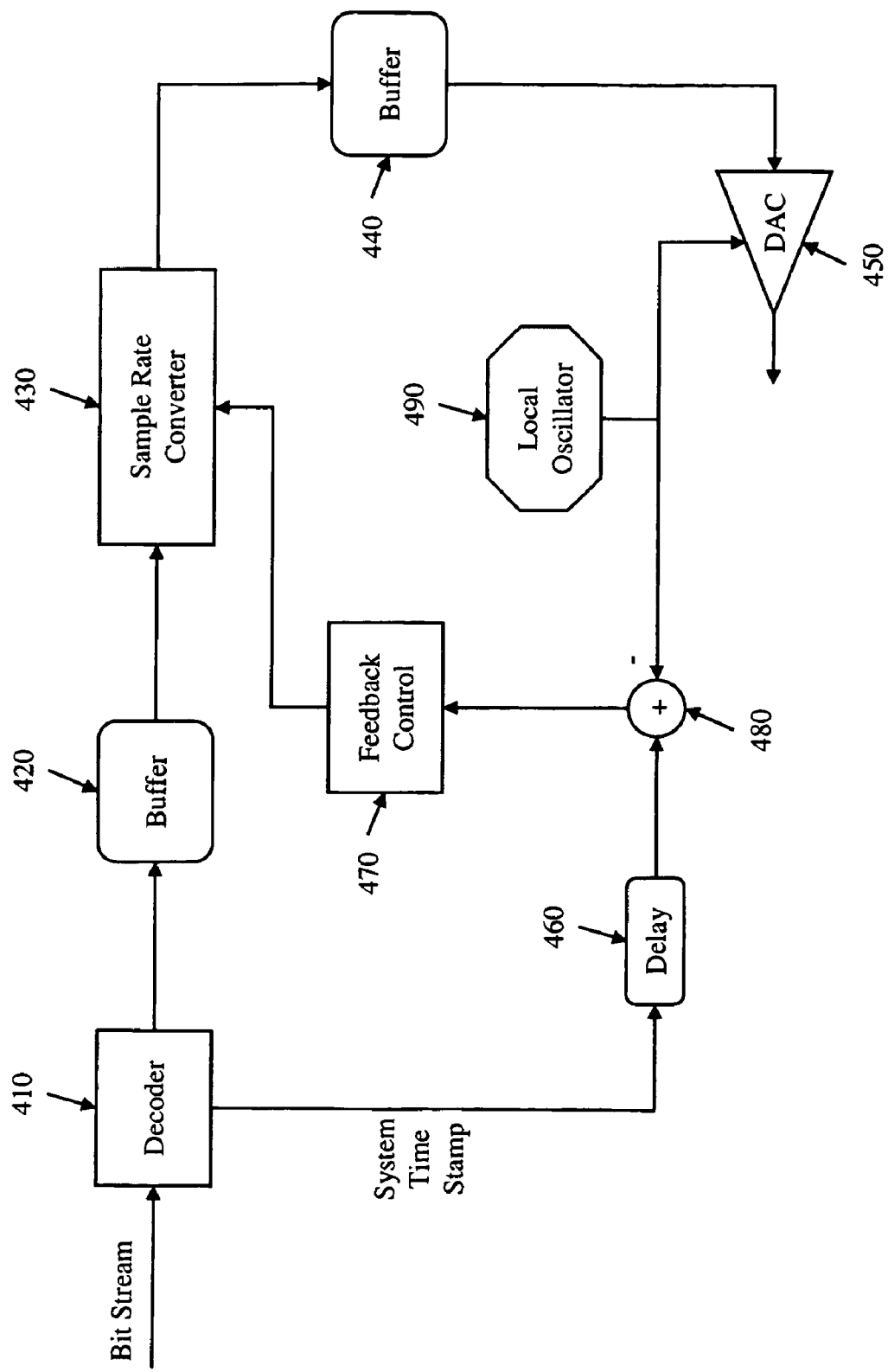
FIG. 4 illustrates an exemplary combined sample rate converter and sample clock synchronizer according to certain embodiments.

FIG. 4 illustrates an exemplary combined sample rate converter and sample clock synchronizer according to certain embodiments. In view of the following discussion, those skilled in the art will understand how to implement the functions of FIG. 4 in hardware, software and any combination thereof. As shown, the exemplary block diagram describes an embodiment of the synchronizer control feedback loop. A decoder 410 decodes the incoming bit stream. The decoded audio signals are sent to a buffer 420 that feeds the sample rate conversion block 430. The sample rate conversion can be a polyphase construct, as previously discussed, where multiple filters corresponding to each phase of the newly created samples are used to filter the original signal. However, certain features of this embodiment are equally applicable for use with other, more basic, sample rate conversion blocks 430. As described above, the output rate can be controlled by the parameter α. The value of α can be changed at each sampling point to get finer control of the sample rate conversion.

The synchronizer feedback loop is also shown in FIG. 4. The system time stamp of the incoming bit stream, via delay 460, and the local oscillator 460 can be compared 480 for any mismatch. The mismatch computation provided by a feedback control 470 should also take into consideration the buffer 420 delays that occur between the two clocks, assuming that delay 460 is either not present or inadequate. The discrepancy in the clock can then be fed back to sample rate converter 430 for determination of the appropriate number for α. The instantaneous clock discrepancy can be computed as $\Delta t = t_{osc} - t_{sys}$, where $t_{osc}$ is the oscillator time stamp and $t_{sys}$ is the system time stamp. $\Delta t$ can be low-pass filtered to obtain a smoothed value, τ. This filtering can be performed as part of the feedback control 470. If the required output sample rate is $F_0$, then $\tau F_0$ number of additional samples will be added to the output of the sample rate converter prior to buffer 440. One can modify or update the value of α by: $\alpha = M/(N+\tau)$. The observation of the clock skew happens approximately every M input samples. By appropriately controlling the value of M, the system can get a finer control of the clock skew.

Note that for most of the clock skew correction of small values, the resampling polyphase filter can remain the same as previously discussed. However, depending on the up or down conversion of the basic sample rate conversion, the polyphase filter might also benefit from a basic band-limiting filter. The polyphase filters can be bandlimiting filters. For cases where the ratio α is less than 1, the polyphase filters can be constructed specifically to correspond to the bandwidth of the output signal. However, for small fractions of decrease in α below 1, the resulting signals will not have a significant impact on the quality of the audio output.

In the synchronizer portion, discussed above, it is easy to choose a high enough sampling rate for the output to eliminate the need for changing the polyphase filter. For example, if the broadcast or streamed audio data has an original sample rate of 32 kHz, the local digital-to-analog converter (DAC) 450 could be set at a 44.1 kHz rate. Thus, the same polyphase filter could be applied since it is completely a case of band-limited sample rate conversion. If the sample rates are the same between the source and the local DAC, only a small decrease (from unity) in the value of α may occasionally occur. These small deviations due to clock skew should not adversely affect the perceptible audio quality, in case an occasional jump in α is seen during the synchronization process.

Although the application has been particularly described with reference to embodiments thereof, it should be readily apparent to those of ordinary skill in the art that various changes, modifications, substitutes and deletions are intended within the form and details thereof, without departing from the spirit and scope of the application. Accordingly, it will be appreciated that in numerous instances some features of certain embodiments will be employed without a corresponding use of other features. Further, those skilled in the art will understand that variations can be made in the number and arrangement of inventive elements illustrated and described in the above figures. It is intended that the scope of the appended claims include such changes and modifications.

What is claimed is:

1. A method of performing sample rate conversion and synchronization, said method comprising:
   decoding an incoming bit stream having a first bit rate;
   determining a phase difference between said incoming bit stream and a local clock signal; and
   generating an output bit stream having a second bit rate using said decoded incoming bit stream, wherein said generating said output bit stream comprises generating said output bit stream based upon said phase difference, and wherein said output bit stream is substantially aligned with said local clock signal.

2. The method of claim 1, wherein said determining a phase difference further comprises:
   accessing a time stamp from said incoming bit stream;
   comparing said time stamp with information from said local clock signal; and
   determining said phase difference based upon said comparison of said time stamp and said information from said local clock signal.

3. The method of claim 1 further comprising:
   buffering said incoming bit stream.

4. The method of claim 1 further comprising:
   buffering said output bit stream; and
   generating an analog signal based upon said buffered output bit stream.

5. The method of claim 1, wherein said generating said output bit stream further comprises:
   determining said second bit rate of said output bit stream;
   adjusting said second bit rate based upon said phase difference to produce an adjusted second bit rate; and
   performing at least one sample rate conversion operation on said incoming bit stream to generate said output bit stream, wherein said at least one sample rate operation comprises a calculation based upon said first bit rate and said adjusted second bit rate.

6. The method of claim 1 further comprising:
   applying a low-pass filter to data corresponding to said phase difference for generating an updated phase difference; and
   generating said output bit stream based upon said updated phase difference.

7. The method of claim 1 further comprising:
   dynamically adjusting said second bit rate to produce a dynamically-adjusted second bit rate; and generating said output bit stream having said dynamically-adjusted second bit rate.

8. An apparatus comprising:
   a decoder for decoding an incoming bit stream having a first bit rate;
   a component for determining a phase difference between said incoming bit stream and a local clock signal; and
   a sample rate conversion component for generating an output bit stream having a second bit rate using said decoded incoming bit stream, wherein said sample rate conversion component is operable to generate said output bit stream based upon said phase difference, and wherein said output bit stream is substantially aligned with said local clock signal.

9. The apparatus of claim 8, wherein said component is further operable to access a time stamp from said incoming bit stream, compare said time stamp with information from said local clock signal, and determine said phase difference based upon said comparison of said time stamp and said information from said local clock signal.

10. The apparatus of claim 8 further comprising:
    a first buffer for buffering said incoming bit stream.

11. The apparatus of claim 8 further comprising:
    a second buffer for buffering said output bit stream; and
    a digital-to-analog conversion component coupled to said second buffer and for generating an analog signal based upon said buffered output bit stream.

12. The apparatus of claim 8, wherein said sample rate conversion component is further operable to determine said second bit rate of said output bit stream, adjust said second bit rate based upon said phase difference to produce an adjusted second bit rate, and perform at least one sample rate conversion operation on said incoming bit stream to generate said output bit stream, wherein said at least one sample rate operation comprises a calculation based upon said first bit rate and said adjusted second bit rate.

13. The apparatus of claim 8, wherein said component is further operable to apply a low-pass filter to data corresponding to said phase difference and for generating an updated phase difference based thereon, and wherein said sample rate conversion component is further operable to generate said output bit stream based upon said updated phase difference.

14. The apparatus of claim 8, wherein said component is further operable to dynamically adjust said second bit rate to produce a dynamically-adjusted second bit rate, and wherein said sample rate conversion component is further operable to generate said output bit stream having said dynamically-adjusted second bit rate.

15. A method of performing sample rate conversion and synchronization, said method comprising:
    decoding input content having a first bit rate;
    determining a phase difference between said input content and a local clock signal; and
    generating output content having a second bit rate using said decoded input content, wherein said generating said output content comprises generating said output content based upon said phase difference, and wherein data comprising said output content is substantially aligned with said local clock signal.

16. The method of claim 15, wherein said input content is selected from audio data and video data.

17. The method of claim 15, wherein said determining a phase difference further comprises:
    accessing a time stamp from said input content;
    comparing said time stamp with information from said local clock signal; and
    determining said phase difference based upon said comparison of said time stamp and said information from said local clock signal.

18. The method of claim 15 further comprising:
    buffering said output content; and
    generating an analog signal based upon said buffered output content.

19. The method of claim 15, wherein said generating said output content further comprises:
    determining said second bit rate of said output content;
    adjusting said second bit rate based upon said phase difference to produce an adjusted second bit rate; and
    performing at least one sample rate conversion operation on said input content to generate said output content, wherein said at least one sample rate operation comprises a calculation based upon said first bit rate and said adjusted second bit rate.

20. The method of claim 15 further comprising:
    dynamically adjusting said second bit rate to produce a dynamically-adjusted second bit rate; and
    generating said output content having said dynamically-adjusted second bit rate.

* * * * *